United States Patent
Li et al.

(10) Patent No.: US 11,335,714 B2
(45) Date of Patent: May 17, 2022

(54) DISPLAY SUBSTRATE AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Pan Li, Beijing (CN); Xinyin Wu, Beijing (CN); Yong Qiao, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 136 days.

(21) Appl. No.: 16/758,803

(22) PCT Filed: Oct. 23, 2019

(86) PCT No.: PCT/CN2019/112770
§ 371 (c)(1),
(2) Date: Apr. 23, 2020

(87) PCT Pub. No.: WO2020/143271
PCT Pub. Date: Jul. 16, 2020

(65) Prior Publication Data
US 2021/0225896 A1    Jul. 22, 2021

(30) Foreign Application Priority Data
Jan. 9, 2019  (CN) .......................... 201920035765.7

(51) Int. Cl.
*H01L 23/62*       (2006.01)
*H01L 27/12*       (2006.01)
(Continued)

(52) U.S. Cl.
CPC ...... *H01L 27/1244* (2013.01); *G02F 1/13629* (2021.01); *G02F 1/136204* (2013.01); *H01L 27/0288* (2013.01); *H01L 27/0296* (2013.01)

(58) Field of Classification Search
CPC ......... G02F 1/136204; G02F 1/134363; G02F 1/136286; G02F 1/1368; G02F 1/134318;
(Continued)

(56) References Cited

U.S. PATENT DOCUMENTS

2007/0296662 A1* 12/2007 Lee ...................... G09G 3/3677
                                                    345/87
2008/0135846 A1*  6/2008 Shin .................... H01L 27/0248
                                                    257/59

(Continued)

FOREIGN PATENT DOCUMENTS

CN       104090436 A      10/2014
CN       205067934 A       3/2016
(Continued)

OTHER PUBLICATIONS

ISA China National Intellectual Property Administration, International Search Report Issued in Application No. PCT/CN2019/112770, WIPO, 18 pages. (Submitted with Partial Translation).

(Continued)

*Primary Examiner* — Samuel Park
(74) *Attorney, Agent, or Firm* — McCoy Russell LLP

(57) ABSTRACT

The present disclosure provides a display substrate and a display device. A display substrate provided by an embodiment of the present disclosure includes: a display region and a peripheral region surrounding the display region; the display region includes: a plurality of gate lines, a plurality of data lines, and a plurality of pixel units, and each of the plurality of pixel units includes a driving transistor and a pixel electrode that are connected to each other; the periph- (Continued)

eral region includes: signal lines and at least one electrostatic discharge structure for performing electrostatic discharge on the signal lines.

20 Claims, 5 Drawing Sheets

(51) Int. Cl.
*G02F 1/1362* (2006.01)
*H01L 27/02* (2006.01)

(58) Field of Classification Search
CPC ........... G02F 1/134372; G02F 1/13629; G02F 1/13452; G02F 1/13454; G02F 2202/22; H01L 27/0266; H01L 27/0292; H01L 27/0296; H01L 27/1225; H01L 27/1244; H01L 27/1255; H01L 29/78669; H01L 29/7869; H01L 27/124; H01L 27/0248; H01L 27/1214; H01L 27/3276; H01L 2924/00; H01L 27/0251; H01L 27/0255; H01L 27/1251; H01L 27/0288
See application file for complete search history.

(56) References Cited

U.S. PATENT DOCUMENTS

| | | | |
|---|---|---|---|
| 2010/0165226 A1* | 7/2010 | Lee | G02F 1/133351 349/40 |
| 2015/0162347 A1 | 6/2015 | Yu et al. | |
| 2015/0371941 A1* | 12/2015 | Nakaiso | H01L 27/0814 257/499 |
| 2015/0380349 A1* | 12/2015 | Yan | H01L 27/124 257/532 |
| 2016/0155408 A1 | 6/2016 | Lee et al. | |

FOREIGN PATENT DOCUMENTS

| | | |
|---|---|---|
| CN | 105655326 A | 6/2016 |
| CN | 106444180 A | 2/2017 |
| CN | 209132559 U | 7/2019 |
| JP | 2000162633 A | 6/2000 |

OTHER PUBLICATIONS

European Patent Office, Extended European Search Report Issued in Application No. 19908801.4, dated Jan. 3, 2022, Germany, 16 pages.

* cited by examiner

DISPLAY SUBSTRATE AND DISPLAY DEVICE

CROSS-REFERENCE TO RELATED APPLICATIONS

This application is the U.S. national phase of PCT Application No. PCT/CN2019/112770 filed on Oct. 23, 2019, which claims a priority to Chinese Patent Application No. 201920035765.7 filed on Jan. 9, 2019, the disclosures of which are incorporated in their entirety by reference herein.

TECHNICAL FIELD

The present disclosure relates to the field of display technology, in particular, to a display substrate and a display device.

BACKGROUND

With the continuous development of display technology, the application range of display devices is becoming more and more extensive, and accordingly the requirement on the working stability of display device is becoming higher and higher. Among them, the static electricity generated in a display device has attracted widespread attention due to an important factor affecting its working stability.

SUMMARY

An object of the present disclosure is to provide a display substrate and a display device.

In order to achieve the above object, the present disclosure provides the following technical solutions.

A first aspect of the present disclosure provides a display substrate includes: a display region and a peripheral region surrounding the display region; the display region includes: a plurality of gate lines, a plurality of data lines, and a plurality of pixel units, and each of the plurality of pixel units includes a driving transistor and a pixel electrode that are connected to each other; and the peripheral region includes: signal lines and at least one electrostatic discharge structure for performing electrostatic discharge on the signal lines.

In one embodiment, the electrostatic discharge structure includes: a first electrostatic discharge pattern connected to the signal lines; a second electrostatic discharge pattern arranged in a different layer from the first electrostatic discharge pattern, in which a first insulating layer is arranged between the second electrostatic discharge pattern and the first electrostatic discharge pattern, so as to insulate the first electrostatic discharge pattern from the second electrostatic discharge pattern, and an orthogonal projection of the second electrostatic discharge pattern on a base substrate of the display substrate at least partially overlaps an orthogonal projection of the first electrostatic discharge pattern on the base substrate.

In one embodiment, an orthogonal projection of the first electrostatic discharge pattern on the base substrate is in a shape of broken line, and the first electrostatic discharge pattern is arranged in parallel to at least a part of the signal lines; an orthogonal projection of the second electrostatic discharge pattern on the base substrate is in a shape of broken line, and the second electrostatic discharge pattern is closed end to end.

In one embodiment, the electrostatic discharge structure further includes: a first electrode connected to the signal lines; and a second electrode connected to the second electrostatic discharge pattern, in which an orthogonal projection of the second electrode on the base substrate at least partially overlaps an orthogonal projection of the first electrode on the base substrate.

In one embodiment, one of the signal lines corresponds to a plurality of the electrostatic discharge structures, in at least two of the plurality of the electrostatic discharge structures: a line width of the first electrostatic discharge pattern in one electrostatic discharge structure along a direction perpendicular to its own extension direction is the same as a line width of the second electrostatic discharge pattern in the same electrostatic discharge structure along a direction perpendicular to its own extension direction; the first electrostatic discharge patterns in different electrostatic discharge structures along a direction perpendicular to their extension directions have different line widths from each other, and/or the second electrostatic discharge patterns in different electrostatic discharge structures along a direction perpendicular to their own extension directions have a different line widths from each other.

In one embodiment, the second electrostatic discharge pattern is connected to a common electrode or a common electrode line of the display substrate.

In one embodiment, the electrostatic discharge structure includes: a third electrostatic discharge pattern arranged in a different layer from the signal lines, in which a second insulation layer is arranged between the third electrostatic discharge pattern and the signal lines; and a plurality of conductive patterns connected to the third electrostatic discharge pattern, in which end portions of a part or all of the conductive patterns away from the third electrostatic discharge pattern are configured as tip portions.

In one embodiment, the third electrostatic discharge pattern includes a first end portion and a second end portion, in which an orthogonal projection of the first end portion on the base substrate of the display substrate and an orthogonal projection of the second end portion on the base substrate at least partially overlap an orthogonal projection of the signal lines on the base substrate.

In one embodiment, the first end portion and/or the second end portion is configured as a tip portion.

In one embodiment, the electrostatic discharge structure further includes: a fourth electrostatic discharge pattern arranged in parallel or not parallel to the signal lines; and/or a fifth electrostatic discharge pattern arranged in parallel or not parallel to the signal lines; an orthogonal projection of the fourth electrostatic discharge pattern on the base substrate and an orthogonal projection of the fifth electrostatic discharge pattern on the base substrate are both located inside an orthogonal projection of the plurality of signal lines on the base substrate; a first end portion of the third electrostatic discharge pattern is located between the signal lines and the fourth electrostatic discharge pattern, and an orthogonal projection of the first end portion of the third electrostatic discharge pattern on the base substrate at least partially overlaps an orthogonal projection of the fourth electrostatic discharge pattern on the base substrate; and a second end portion of the third electrostatic discharge pattern is located between the signal lines and the fifth electrostatic discharge pattern, and an orthogonal projection of the second end portion of the third electrostatic discharge pattern on the base substrate at least partially overlaps an orthogonal projection of the fifth electrostatic discharge pattern on the base substrate.

In one embodiment, the fourth electrostatic discharge pattern and/or the fifth electrostatic discharge pattern are arranged in a same layer and made of a same material as the active layer in the display substrate.

In one embodiment, an overlapping portion between the orthogonal projection of the fourth electrostatic discharge pattern on the base substrate and the orthogonal projection of the first end portion of the third electrostatic discharge pattern on the base substrate is formed of an intrinsic semiconductor material; and/or an overlapping portion between the orthogonal projection of the fifth electrostatic discharge pattern on the base substrate and the orthogonal projection of the second end portion of the third electrostatic discharge pattern on the base substrate is formed of an intrinsic semiconductor material.

In one embodiment, the electrostatic discharge structure includes: a comb-shaped sixth electrostatic discharge pattern, including a plurality of first comb teeth and a first connection portion for connecting one end of the plurality of first comb teeth, in which the first connection portion is connected to the signal lines, and end portions of a part or all of the plurality of first comb teeth away from the first connection portion are configured as tip portions; and a seventh electrostatic discharge pattern, located on a side of the plurality of first comb teeth of the sixth electrostatic discharge pattern away from the first connection portion, in which a third insulation layer is arranged between the seventh electrostatic discharge pattern and the sixth electrostatic discharge pattern.

In one embodiment, the seventh electrostatic discharge pattern is comb-shaped, and includes a plurality of second comb teeth and a second connection portion for connecting one end of the plurality of second comb teeth, and end portions of a part or all of the plurality of second comb teeth away from the second connection portion are configured as tip portions; an orthogonal projection of the tip portions of the plurality of second comb teeth on the base substrate of the display substrate is opposite to an orthogonal projection of the tip portions of the plurality of first comb teeth on the base substrate.

In one embodiment, the sixth electrostatic discharge pattern and the seventh electrostatic discharge pattern are arranged in a same layer or a different layer.

Based on the technical solution of the above display substrate, a second aspect of the present disclosure provides a display device including the above display substrate.

BRIEF DESCRIPTION OF THE DRAWINGS

The drawings described hereafter are intended to provide a further understanding of the present disclosure, and constitute a part of the embodiments of the present disclosure. The illustrative embodiments of the present disclosure and the description thereof are intended to illustrate the present disclosure, and do not constitute an improper limitation of the present disclosure.

DETAILED DESCRIPTION

Figure 1:
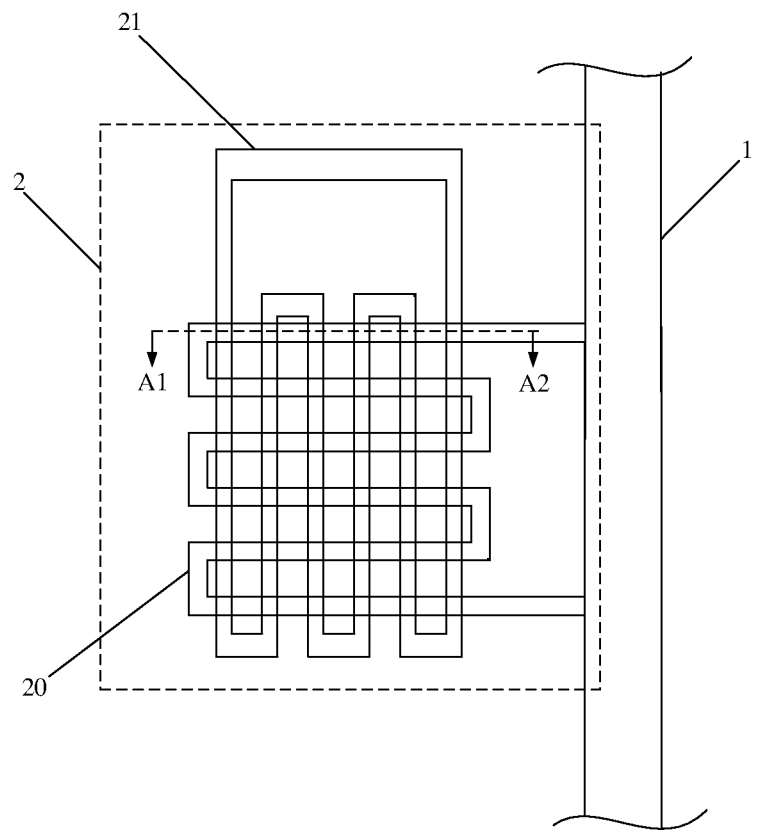
FIG. 1 is a first schematic view showing an electrostatic discharge structure according to an embodiment of the present disclosure.
Figure 2:
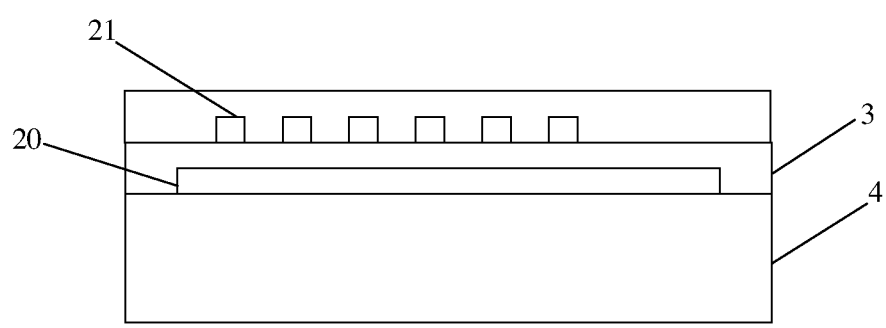
FIG. 2 is a schematic cross-sectional view taken along the direction A1-A2 in FIG. 1.

In order to further illustrate the display substrate and the display device provided by the embodiments of the present disclosure, the present disclosure will be described in detail hereinafter in conjunction with the drawings.

In the related art, there are more and more types of display devices, and the application range is more and more extensive. Taking a liquid crystal display (LCD) device as an example, an LCD display device generally includes an array substrate and a color filter substrate that arranged opposite to each other, and a liquid crystal material arranged therebetween. Among them, a gate driving circuit is generally arranged on the array substrate. The entire gate driving circuit starts to work under the control of the initial pulse signal line, and drive the entire LCD display device to achieve the display function under the coordinated control of the signal lines, such as the power signal line, the clock signal line and the common electrode line. However, the LCD display device is prone to generate static electricity during production and practical application, and the static electricity is prone to affect various signal lines in the LCD display device. This leads to deviations in its transmission signals, and even severe signal line breakage in severe cases, and thus the normal operation of the display device is affected.

Based on the existence of the above problems, an embodiment of the present disclosure provides a display substrate, including a display region and a peripheral region surrounding the display region. The display region includes: a plurality of gate lines, a plurality of data lines, and a plurality of pixel units, and each of the plurality of pixel units includes a driving transistor and a pixel electrode that are connected to each other. As shown in FIG. 1 to FIG. 10, the peripheral region includes: signal lines 1 and at least one electrostatic discharge structure 2 for performing electrostatic discharge on the signal lines 1.

In the embodiment of the present disclosure, there are multiple distribution manners for a plurality of gate lines, a plurality of data lines, and a plurality of pixel units included in the display region. Exemplarily, a plurality of pixel regions distributed in an array in a display region is defined by a plurality of gate lines and a plurality of data lines, each pixel region corresponds to one pixel unit, and each pixel unit includes a driving transistor and a pixel electrode that are connected to each other. The driving transistor is used to provide a driving signal to the pixel electrode, thereby driving the pixel unit to emit light.

In the embodiment of the present disclosure, the signal lines included in the peripheral region may be various. Exemplarily, the signal line may include a common electrode line, a gate line lead connected to the gate line, a data line lead connected to the data line, etc.

In this embodiment, the electrostatic discharge structure 2 may be arranged within a preset range around the signal lines 1 in the display substrate. The electrostatic discharge structure 2 may be connected to the signal lines 1 to be protected, or may be located around the signal lines 1 to be protected but not connected to the signal lines 1 to be protected. For example, the orthogonal projection of the electrostatic discharge structure 2 on the base substrate of the display substrate may at least partially overlap the orthogonal projection of the signal lines 1 to be protected on the base substrate, thereby being capable of discharging the static electricity in the signal lines 1 by the electrostatic discharge structure 2, and ensuring that the signal lines 1 are capable of stably transmitting the corresponding signal.

As can be known from the specific structure of the display substrate provided according to the embodiment of the present disclosure, in the display substrate of the embodiment of the present disclosure, the peripheral region includes the signal lines 1 and the electrostatic discharge structure 2 capable of performing electrostatic discharge on the signal lines 1, so that the static electricity generated on the signal lines 1 can be discharged through the electrostatic discharge structure 2 during the preparing process or the working process of the display substrate. Thus the signal lines 1 can stably and accurately transmit the corresponding signal, and thereby the work stability of the display substrate is well ensured.

The specific structure of the electrostatic discharge structure in the embodiments of the present disclosure may be various. Hereinafter, several specific structures of the electrostatic discharge structure 2 will be described with reference to FIGS. 1 to 10, and the principle of discharging static electricity will be described in detail.

In one embodiment, as shown in FIGS. 1 to 4, the electrostatic discharge structure 2 may include: a first electrostatic discharge pattern 20 connected to the signal lines 1; and a second electrostatic discharge pattern 21 arranged in a different layer from the first electrostatic discharge pattern 20, in which a first insulating layer 3 is arranged between the second electrostatic discharge pattern 21 and the first electrostatic discharge pattern 20, so as to insulate the first electrostatic discharge pattern 20 from the second electrostatic discharge pattern 21, an orthogonal projection of the second electrostatic discharge pattern 21 on a base substrate 4 of the display substrate at least partially overlaps an orthogonal projection of the first electrostatic discharge pattern 20 on the base substrate 4.

In this embodiment, the electrostatic discharge structure 2 includes: a first electrostatic discharge pattern 20 connected to the signal lines 1, a second electrostatic discharge pattern 21 capable of overlapping the first electrostatic discharge pattern 20 in a direction perpendicular to the base substrate 4, and a first insulating layer 3 arranged between the first electrostatic discharge pattern 20 and the second electrostatic discharge pattern 21, so that a capacitor structure can be formed between the first electrostatic discharge pattern 20 and the second electrostatic discharge pattern 21. In this way, when the static electricity is generated on the signal lines 1, the static electricity can be introduced into the capacitor structure via the first electrostatic discharge pattern 20 and stored in the capacitor structure. When the static electricity stored in the capacitor structure exceeds a certain value, the static electricity will break down the capacitor, thereby releasing the static electricity.

It should be understood that both the first electrostatic discharge pattern 20 and the second electrostatic discharge pattern 21 are made of a conductive material. Exemplarily, the conductive material may be a metal material, e.g., Cu, Al, etc.; or a transparent conductive material, e.g., ITO (indium tin oxide), IZO (zinc tin oxide), etc.

In addition, in this embodiment, the above-mentioned first electrostatic discharge pattern 20 and the second electrostatic discharge pattern 21 may be arranged in the same layer and made of the same material as other film layers having conductive properties in the display substrate. In this way, the first electrostatic discharge pattern 20, the second electrostatic discharge pattern 21, and other film layers having a conductive property in the display substrate can be simultaneously manufactured through a single patterning process. Thus, this avoids an additional patterning process added due to the preparation of the first electrostatic discharge pattern 20 and the second electrostatic discharge pattern 21, improves the production efficiency of the display substrate, and reduces the production cost.

In this embodiment, setting the electrostatic discharge structure 2 to be the above structure can export the static electricity generated on the signal lines 1 to the capacitor structure in real time through the first electrostatic discharge pattern 20, thereby avoiding the accumulation of static electricity on the signal lines 1, and better ensuring the working performance of the signal lines 1.

In this embodiment, as shown in FIG. 1, the first electrostatic discharge pattern 20 and the second electrostatic discharge pattern 21 may be set as follows: the orthogonal projection of the first electrostatic discharge pattern 20 on the base substrate 4 is in a shape of a broken line, and the first electrostatic discharge pattern 20 is arranged in parallel with at least a part of the signal lines 1; and the orthogonal projection of the second electrostatic discharge pattern 21 on the base substrate 4 is in a shape of a broken line, and the second electrostatic discharge pattern 21 is closed end to end.

In this way, arranging the first electrostatic discharge pattern 20 in parallel with at least a part of the signal lines 1 can better transmit the static electricity generated on the signal lines 1 to the electrostatic discharge structure 2. In addition, making the orthogonal projections of both the first electrostatic discharge pattern 20 and the second electrostatic discharge pattern 21 on the base substrate 4 into a shape of broken line is capable of preparing a plurality of overlapping regions between the first electrostatic discharge pattern 20 and the second electrostatic discharge pattern 21 in a direction perpendicular to the base substrate 4, that is, capable of forming a plurality of capacitor structures. In this way, the static electricity generated on the signal lines 1 can be stored in a plurality of capacitor structures through the first electrostatic discharge pattern 20. When each static electricity stored in the capacitor structure exceeds a certain value, the static electricity will break down the capacitor, thereby releasing the static electricity. In addition, closing the second electrostatic discharge pattern 21 end to end is capable of forming the second electrostatic discharge pattern 21 into a closed pattern, thereby achieving a better discharge of static electricity.

Figure 3:
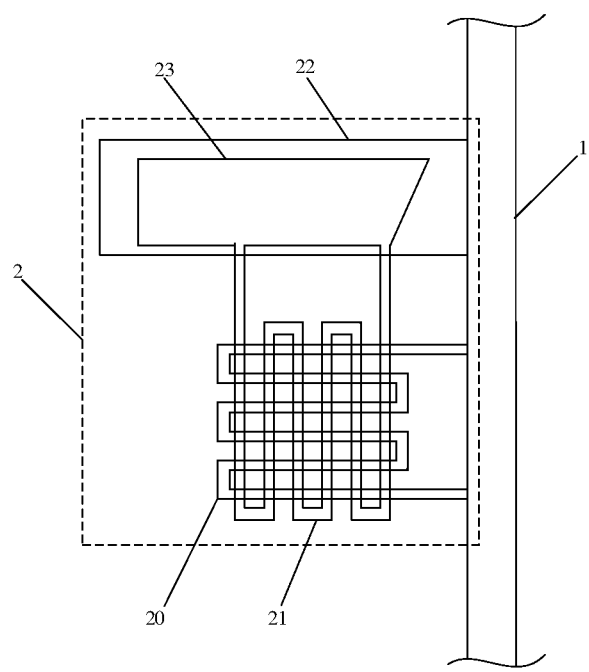
FIG. 3 is a second schematic view showing an electrostatic discharge structure according to an embodiment of the present disclosure.

Further, as shown in FIG. 3, the electrostatic discharge structure 2 may further include: a first electrode 22 connected to the signal lines 1; a second electrode 23 connected to the second electrostatic discharge pattern 21, in which an orthogonal projection of the second electrode 23 on the base substrate 4 at least partially overlaps an orthogonal projection of the first electrode 22 on the base substrate 4.

In this way, making the electrostatic discharge structure 2 to include the first electrode 22 and the second electrode 23 described above, and at least partially overlapping the first electrode 22 and the second electrode 23 in a direction perpendicular to the base substrate 4 are capable of forming a capacitor structure having a larger storage capacity between the first electrode 22 and the second electrode 23. In this way, a large capacitance is formed between the first electrode 22 and the second electrode 23, and static electricity can be accumulated again. When a large static electricity is generated on the signal lines 1, the static electricity can be introduced through the first electrode 22 into the capacitor structure formed of the first electrode 22 and the second electrode 23, thereby achieving a better discharge of static electricity and avoiding the influence of static electricity on the signal lines 1.

Figure 4:
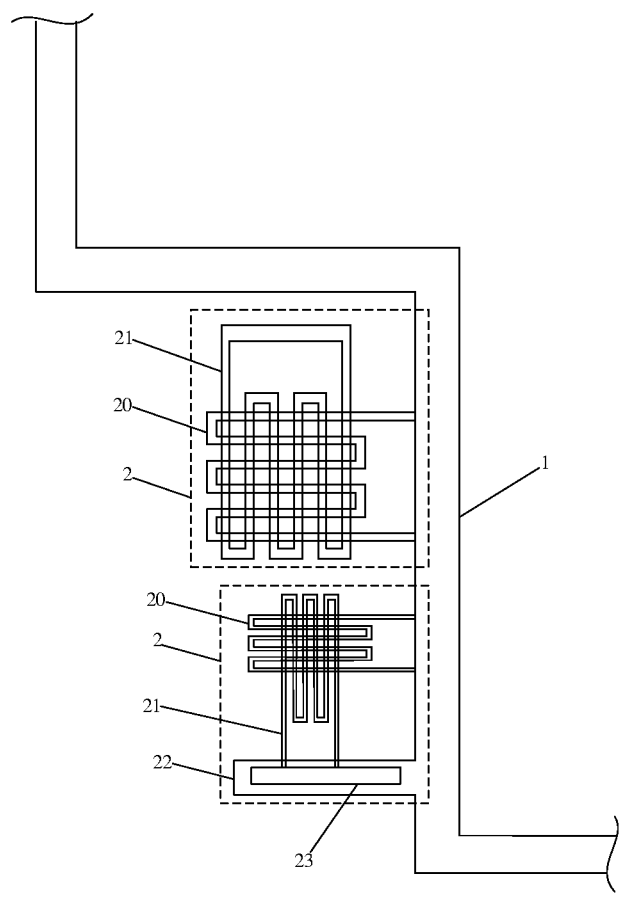
FIG. 4 is a third schematic view showing an electrostatic discharge structure according to an embodiment of the present disclosure.
Figure 5:
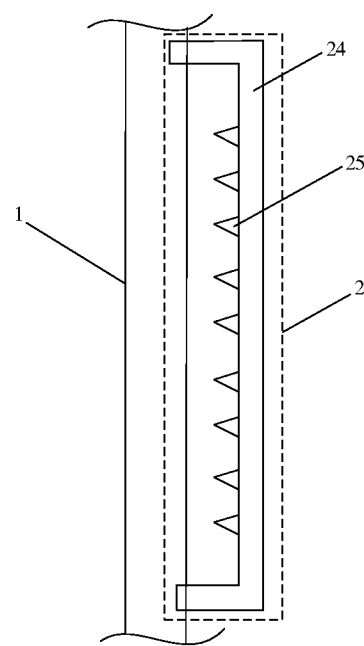
FIG. 5 is a fourth schematic view showing an electrostatic discharge structure according to an embodiment of the present disclosure.

Further, as shown in FIG. 4, in the display substrate provided by the embodiment of the present disclosure, one of the signal lines 1 may correspond to a plurality of electrostatic discharge structures 2. When one of the signal lines corresponds to a plurality of the electrostatic discharge structures, in at least two electrostatic discharge structures 2, the line width of the first electrostatic discharge pattern 20 in the same electrostatic discharge structure 2 along a direction perpendicular to its own extension is same as the line width of the second electrostatic discharge pattern 21 along a direction perpendicular to its own extension. In addition, in at least two electrostatic discharge structures 2, the first electrostatic discharge patterns 20 in the different electrostatic discharge structure 2 have different line widths along a direction perpendicular to their extension, and/or the second electrostatic discharge patterns 21 in the different electrostatic discharge structures 2 have different line widths along a direction perpendicular to their extension.

In this way, making one of the signal lines 1 to correspond to a plurality of electrostatic discharge structures 2 is capable of discharging the static electricity generated on the signal lines 1 through the plurality of electrostatic discharge structures 2, thereby better improving the electrostatic discharge effect. Moreover, in the same electrostatic discharge structure 2, the line width of the first electrostatic discharge pattern 20 in a direction perpendicular to its own extension is same as the line width of the second electrostatic discharge pattern 21 in a direction perpendicular to its own extension, and in at least two electrostatic discharge structures 2, the first electrostatic discharge patterns 20 and/or the second electrostatic discharge patterns 21 in different electrostatic discharge structures 2 have different line widths along a direction perpendicular to their extension, so that the storage capacities of the capacitor structures formed by different electrostatic discharge structures 2 are different, and thus one signal lines 1 can correspond to a capacitor structure with multi-level storage capacity. In this way, when the static electricity generated on the signal lines 1 is relatively small, it can be discharged through a capacitor structure with a relatively small storage capacity; and when the static electricity generated on the signal lines 1 is relatively large, it can be discharged through a capacitor structure with a relatively large storage capacity. Therefore, making one signal line 1 to correspond to a plurality of electrostatic discharge structures 2 is capable of achieving a good discharge of static electricity at all levels generated on the signal lines 1, and better ensuring the working performance of the signal line 1.

Further, in the embodiment of the present disclosure, the second electrostatic discharge pattern 21 may be suspended or may be connected to a common electrode or a common electrode line of the display substrate.

When the second electrostatic discharge pattern 21 is connected to a common electrode or a common electrode line of the display substrate, the second electrostatic discharge pattern 21 can be connected to a stable common electrode signal, thereby ensuring that the capacitor structure formed between the first electrostatic discharge pattern 20 and the second electrostatic discharge pattern 21 have stable storage performance, and it is not easily affected by other interference signals generated in the display substrate.

In another embodiment, as shown in FIG. 5 to FIG. 8, the electrostatic discharge structure 2 may include: a third electrostatic discharge pattern 24 arranged in a different layer from the signal lines 1, in which a second insulation layer (for example, the insulating film layer 6) is arranged between the third electrostatic discharge pattern 24 and the signal lines 1; and a plurality of conductive patterns 25 connected to the third electrostatic discharge pattern 24, a part or all of ends of the conductive patterns 25 away from the third electrostatic discharge pattern 24 are configured as tip portions.

Exemplarily, the third electrostatic discharge pattern 24 may be arranged around the signal lines 1 and arranged at a different layer from the signal lines 1. The third electrostatic discharge pattern 24 is provided with a plurality of conductive patterns 25, the end portions of the plurality of conductive patterns 25 away from the third electrostatic discharge pattern 24 are all tip portions, and both the third electrostatic discharge pattern 24 and the plurality of conductive pattern 25 can be made of a conductive material. In this way, when static electricity is generated on the signal lines 1, the electrostatic charges can be transferred to the third electrostatic discharge pattern 24, and discharged through the tip portions of the plurality of conductive patterns 25 in the third electrostatic discharge pattern 24, thereby avoiding the influence of the static electricity on the signal lines 1.

In addition to discharge the static electricity generated on the signal lines 1, the above-mentioned third electrostatic discharge pattern 24 can also discharge the static electricity located around the signal lines 1 through the tip portions of the plurality of conductive patterns 25, thereby avoiding the static electricity generated around the signal line 1 from affecting the signal lines 1.

It should be understood that the above-mentioned electrostatic discharge structure 2 including the third electrostatic discharge pattern 24 and the plurality of conductive patterns 25 can protect various signal lines 1 in the display substrate. Exemplarily, the electrostatic discharge structure 2 may be applied to the signal lines 1 located on the edge of the display substrate, thereby preventing the static electricity generated on the signal lines 1 and external static electricity from affecting the signal lines 1 located on the edge of the display substrate.

In addition, the above-mentioned third electrostatic discharge pattern 24 may be formed as an integrated structure with the plurality of conductive patterns 25. In this way, the third electrostatic discharge pattern 24 and the plurality of conductive patterns 25 can be formed simultaneously through a single patterning process, thereby better simplifying the process flow.

Figure 6:
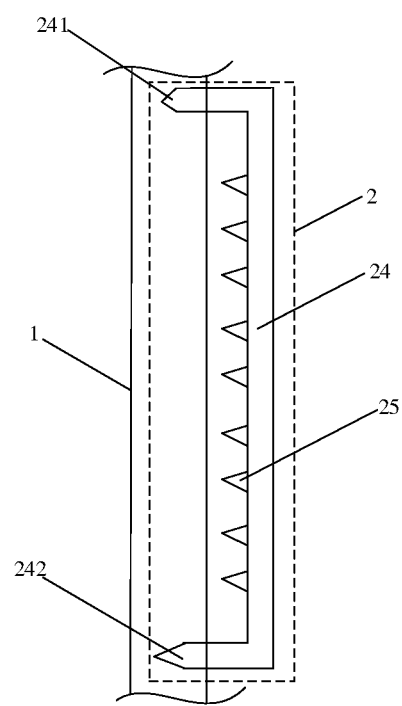
FIG. 6 is a fifth schematic view showing an electrostatic discharge structure according to an embodiment of the present disclosure.

Further, as shown in FIG. 6, in this embodiment, the third electrostatic discharge pattern 24 may include a first end portion 241 and a second end portion 242. The orthogonal projection of the first end portion 241 on the base substrate of the display substrate and the orthogonal projection of the second end portion 242 on the base substrate at least partially overlap the orthogonal projection of the signal lines 1 on the base substrate.

In this way, the third electrostatic discharge pattern 24 includes the first end portion 241 and the second end portion 242, and the first end portion 241 and the second end portion 242 in a direction perpendicular to the base substrate at least partially overlap the signal lines 1, so that a capacitor structure is formed between the first end portion 241 of the third electrostatic discharge pattern 24 and the signal lines 1, and a capacitor structure is formed between the second end portion 242 of the third electrostatic discharge pattern 24 and the signal line 1. In this way, when the static electricity is generated on the signal lines 1, the static electricity can break through the two capacitor structures, thereby realizing the discharge of the static electricity generated on the signal line 1.

Further, in this embodiment, the first end portion 241 and/or the second end portion 242 of the third electrostatic discharge pattern 24 may be configured as tip portions.

In this way, the first end portion 241 and/or the second end portion 242 of the third electrostatic discharge pattern 24 are set as tip portions, so that the static electricity received by the third electrostatic discharge pattern 24 can not only be discharged through the plurality of conductive patterns 25, but also be released through the first end portion 241 and/or the second end portion 242, so as to better prevent the static electricity from affecting the signal lines 1.

Figure 7:
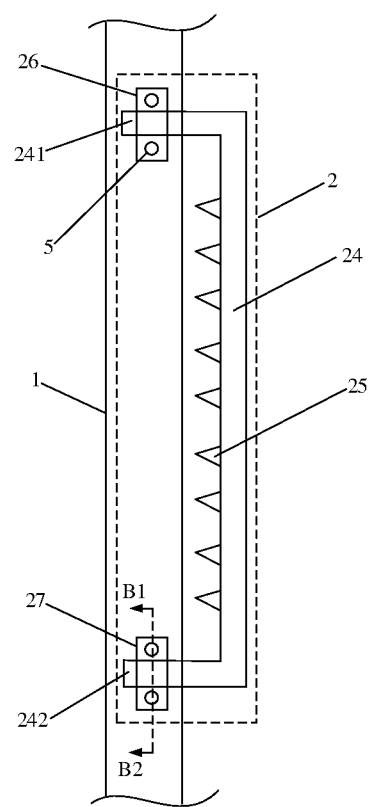
FIG. 7 is a sixth schematic view showing an electrostatic discharge structure according to an embodiment of the present disclosure.
Figure 8:
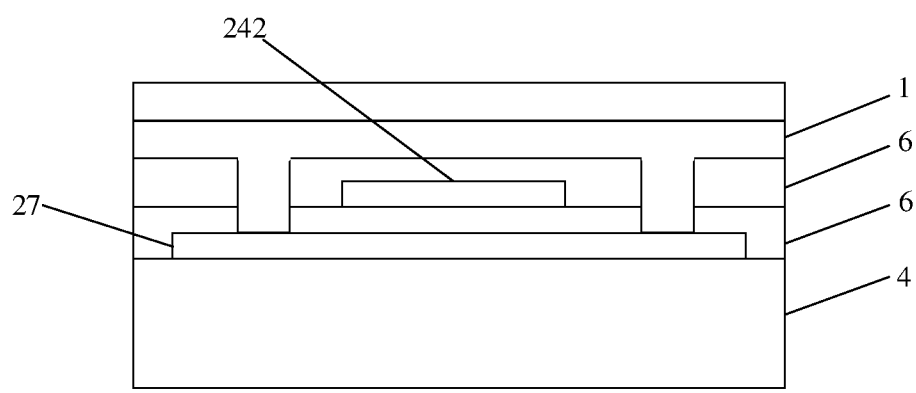
FIG. 8 is a schematic cross-sectional view taken along the direction B1-B2 in FIG. 7.

Further, as shown in FIG. 7 and FIG. 8, the electrostatic discharge structure 2 in this embodiment may further include a fourth electrostatic discharge pattern 26, which may be arranged in parallel or not parallel with the signal lines 1, and/or a fifth electrostatic discharge pattern 27, which may be arranged in parallel or not parallel with the signal lines 1, in which the orthogonal projections of the fourth electrostatic discharge pattern 26 and the fifth electrostatic discharge pattern 27 on the substrate 4 are both located inside the orthogonal projection of the signal lines 1 on the base substrate 4.

A first end portion 241 of the third electrostatic discharge pattern 24 is located between the plurality of signal lines 1 and the fourth electrostatic discharge pattern 26, and an orthogonal projection of the first end portion 241 of the third electrostatic discharge pattern 24 on the base substrate 4 at least partially overlaps an orthogonal projection of the fourth electrostatic discharge pattern 26 on the base substrate 4.

A second end portion 242 of the third electrostatic discharge pattern 24 is located between the plurality of signal lines 1 and the fifth electrostatic discharge pattern 27, and an orthogonal projection of the second end portion 242 of the third electrostatic discharge pattern 27 on the base substrate 4 at least partially overlaps an orthogonal projection of the fifth electrostatic discharge pattern 27 on the base substrate 4.

In this way, the electrostatic discharge structure 2 is set as the above structure, so that a sandwich structure can be formed between the signal lines 1, the first end portion 241 of the third electrostatic discharge pattern 24, and the fourth electrostatic discharge pattern 26, so that the first end portion 241 of the third electrostatic discharge pattern 24 can form a capacitor structure with the signal lines 1 and the fourth electrostatic discharge pattern 26, respectively. In this way, the static electricity generated on the signal line 1 can be discharged by breaking through the capacitor structure.

Similarly, a sandwich structure may also be formed between the signal lines 1, the second end portion 242 of the third electrostatic discharge pattern 24 and the fifth electrostatic discharge pattern 27, so that the second end portion 242 of the third electrostatic discharge pattern 24 can form capacitive structures with the signal lines 1 and the fifth electrostatic discharge pattern 27, respectively. In this way, the static electricity generated on the signal lines 1 can be discharged by breaking through the capacitor structure.

It should be understood that, since the above-mentioned fourth electrostatic discharge pattern 26 and the fifth electrostatic discharge pattern 27 are arranged in different layers from the signal lines 1, when the fourth electrostatic discharge pattern 26 and the fifth electrostatic discharge pattern 27 are arranged in parallel with the signal lines 1, via holes 5 may be arranged between the fourth electrostatic discharge pattern 26 and the signal lines 1 and between the fifth electrostatic discharge pattern 27 and the signal lines 1, and the fourth electrostatic discharge pattern 26 is arranged in parallel with the signal lines 1 and the fifth electrostatic discharge pattern 27 is arranged in parallel with the signal lines 1 through the via holes 5.

It should also be noted that an insulating film layer 6 is formed between the fourth electrostatic discharge pattern 26 and the first end portion 241 of the third electrostatic discharge pattern 24 and between the fifth electrostatic discharge pattern 27 and the second end portion 242 of the third electrostatic discharge pattern 24. In addition, an insulating film layer 6 is also formed between the first end portion 241 of the third electrostatic discharge pattern 24 and the signal lines 1, and between the second end portion 242 of the third electrostatic discharge pattern 24 and the signal lines 1.

Further, the fourth electrostatic discharge pattern 26 and/or the fifth electrostatic discharge pattern 27 included in the above-mentioned electrostatic discharge structure 2 may be arranged in the same layer and made of the same material as the active layer in the display substrate.

In this way, by setting the fourth electrostatic discharge pattern 26 and/or the fifth electrostatic discharge pattern 27 to be arranged in the same layer and made of the same material as the active layer in the display substrate, it is possible to simultaneously produce the fourth electrostatic discharge pattern 26, the fifth electrostatic discharge pattern 27 and the active layer in the display substrate through a single patterning process, thereby avoiding the addition of a patterning process specific for producing the fourth electrostatic discharge pattern 26 and the fifth electrostatic discharge pattern 27, and better simplifying the manufacturing process of the electrostatic discharge structure 2 and production costs.

Further, an overlapping portion between the orthogonal projection of the fourth electrostatic discharge pattern 26 on the base substrate 4 and the orthogonal projection of the first end portion 241 of the third electrostatic discharge pattern 24 on the base substrate 4 is formed of an intrinsic semiconductor material; and/or an overlapping portion between the orthogonal projection of the fifth electrostatic discharge pattern 27 on the base substrate 4 and the orthogonal projection of the second end portion 242 of the third electrostatic discharge pattern 24 on the base substrate 4 may be formed of an intrinsic semiconductor material.

Since the intrinsic semiconductor material has better conductivity in a high-temperature environment, by allowing an overlapping portion between the orthogonal projection of the fourth electrostatic discharge pattern 26 on the base substrate 4 and the orthogonal projection of the first end portion 241 of the third electrostatic discharge pattern 24 on the base substrate 4 to be formed of an intrinsic semiconductor material, i.e., be formed into a first intrinsic semiconductor pattern; and/or by allowing an overlapping portion between the orthogonal projection of the fifth electrostatic discharge pattern 27 on the base substrate 4 and the orthogonal projection of the second end portion 242 of the third electrostatic discharge pattern 24 on the base substrate 4 to be formed of an intrinsic semiconductor material, i.e., be formed into a second intrinsic semiconductor pattern, when the display substrate is actually applied, the fourth electrostatic discharge pattern 26 and the fifth electrostatic discharge pattern 27 can better discharge the static electricity generated in the display substrate as the temperature of the display rises.

Figure 9:
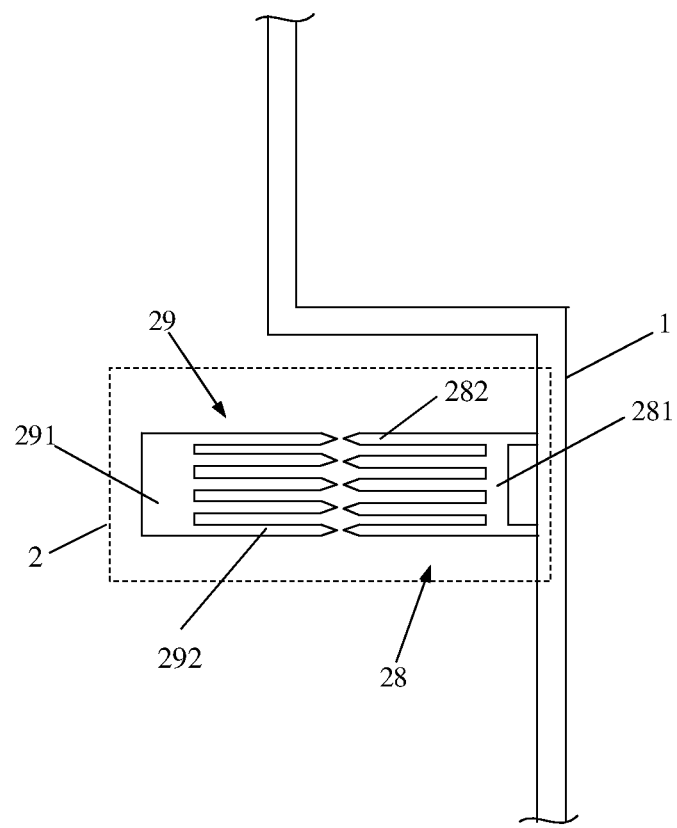
FIG. 9 is a seventh schematic view showing an electrostatic discharge structure according to an embodiment of the present disclosure.

In another embodiment, as shown in FIG. 9, the electrostatic discharge structure 2 may include:

a comb-shaped sixth electrostatic discharge pattern 28, including a plurality of first comb teeth 282 and a first connection portion 281 for connecting one end of the plurality of first comb teeth 282, in which the first connection portion 281 is connected to the signal lines 1, and end portions of a part or all of the plurality of first comb teeth 282 away from the first connection portion 281 are configured as tip portions; and a seventh electrostatic discharge pattern 29, located on a side of the plurality of first comb teeth 282 of the sixth electrostatic discharge pattern 28 away from the first connection portion 281, in which a third insulation layer is arranged between the seventh electrostatic discharge pattern 29 and the sixth electrostatic discharge pattern 28.

In this way, by setting the electrostatic discharge structure 2 to be the above structure, the static electricity generated on the signal lines 1 can be transmitted to the sixth electrostatic discharge pattern 28 and discharged through the tip portion of the sixth electrostatic discharge pattern 28. At the same time, since the seventh electrostatic discharge pattern 29 is arranged on the side of the first comb tooth 282 of the sixth electrostatic discharge pattern 28 away from the first connection portion 281, the electrostatic charge generated on the signal lines 1 can also be transferred to the seventh electrostatic discharge pattern 29 by the sixth electrostatic discharge pattern 28, and discharged through the seventh electrostatic discharge pattern 29. As can be seen, the electrostatic discharge structure 2 of the above structure can discharge through the sixth electrostatic discharge pattern 28 and the seventh electrostatic discharge pattern 29, thereby realizing a faster and more efficient discharge of the static electricity generated on the signal lines 1.

Further, the seventh electrostatic discharge pattern 29 may be in a comb shape, and include a plurality of second comb teeth 292 and a second connection portion 291 for connecting one end of the plurality of second comb teeth 292, and end portions of a part or all of the second comb teeth 292 away from the second connection portion 291 are configured as tip portions. Moreover, an orthogonal projection of the tip portions of the plurality of second comb teeth 292 on the base substrate of the display substrate is opposite to an orthogonal projection of the tip portions of the plurality of first comb teeth 282 on the base substrate.

In this way, by setting the seventh electrostatic discharge pattern 29 into a comb shape and setting the end portions of a part or all of the second comb teeth 292 into tip portions, it is possible to better discharge the static electricity transferred to the seventh electrostatic discharge pattern 29 through the tip portions of the second comb teeth 292. Moreover, by setting the orthogonal projection of the tip portions of the second comb tooth 292 on the base substrate of the display substrate to be opposed to the orthogonal projection of the tip portions of the first comb tooth 282 on the base substrate, it is possible to more easily transfer the charge of the static electricity generated on the signal lines 1 to the seventh electrostatic discharge pattern 29 through the sixth electrostatic discharge pattern 28, thereby better discharging the static electricity generated on the signal line 1.

Further, the plurality of first comb teeth 282 of the sixth electrostatic discharge pattern 28 may correspond to the plurality of second comb teeth 292 of the seventh electrostatic discharge pattern 29 in a one-to-one manner. In this way, it is more conducive to transfer the charge of static electricity to the seventh electrostatic discharge pattern 29 through the sixth electrostatic discharge pattern 28, thereby better realizing the electrostatic discharge on the signal line 1.

Further, the sixth electrostatic discharge pattern 28 and the seventh electrostatic discharge pattern 29 may be arranged in a same layer or a different layer according to actual production requirements.

Exemplarily, the sixth electrostatic discharge pattern 28 and the seventh electrostatic discharge pattern 29 are arranged in a same layer. In this way, the sixth electrostatic discharge pattern 28 and the seventh electrostatic discharge pattern 29 can be produced simultaneously by a single patterning process, thereby simplifying the preparation process of the electrostatic discharge structure 2 and the production costs.

Figure 10:
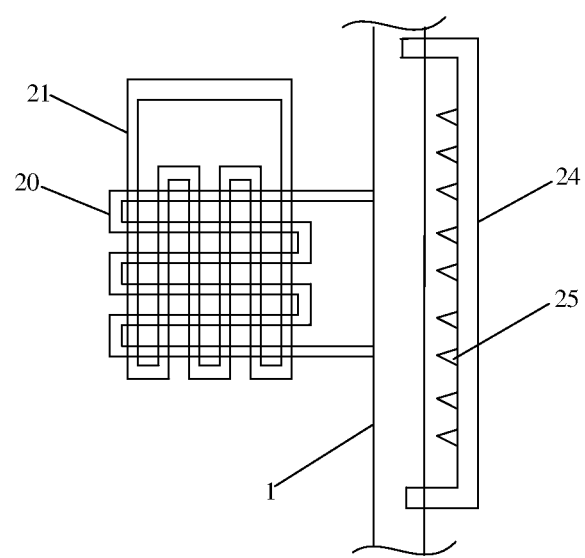
FIG. 10 is an eighth structure view showing an electrostatic discharge structure according to an embodiment of the present disclosure.

In addition, it should be noted that various specific structures included in the electrostatic discharge structure 2 provided by the embodiment of the present disclosure may be used in combination with each other. For example, as shown in FIG. 10, the electrostatic discharge structure included in the display substrate may include a first electrostatic discharge pattern 20, a second electrostatic discharge pattern 21, a third electrostatic discharge pattern 24, and the conductive pattern 25 on the third electrostatic discharge pattern 24.

It should be understood that the specific structures in the above several embodiments can be used in combination with each other, and any combination of these embodiments should fall within the protection scope of the present disclosure.

Another embodiment of the present disclosure further provides a display device including the display substrate provided by the above embodiments of the present disclosure.

Since the display substrate provided by the embodiment of the present disclosure is provided with an electrostatic discharge structure 2, and the electrostatic discharge structure 2 capable of performing electrostatic discharge on the signal lines 1, the static electricity generated on the signal lines 1 can be discharged through the electrostatic discharge structure during the preparing process or the working process of the display substrate, and thus the signal lines 1 can stably and accurately transmit the corresponding signal, thereby well ensuring the work stability of the display substrate. Therefore, when the display device provided by the embodiment of the present disclosure includes the display substrate provided by the above embodiments of the present disclosure, it also has the effects such as stable and accurate signal transmission and stable operation performance of the display device.

Unless otherwise defined, technical terms or scientific terms used herein have the normal meaning commonly understood by one skilled in the art in the field of the present disclosure. The words "first", "second", and the like used herein does not denote any order, quantity, or importance, but rather merely serves to distinguish different components. The "including" or "comprising" and the like used herein means that the element or item appeared in front of the word encompasses the element or item and their equivalents listed after the word, and does exclude other elements or items. The word "connected" or "connecting" and the like used herein are not limited to physical or mechanical connections, but may include electrical connections, whether direct or indirect.

"On", "under", "left", "right" and the like used herein are only used to represent relative positional relationships, and when the absolute position of the described object is changed, the relative positional relationship may also be changed, accordingly. It will be understood that when an element, such as a layer, film, region, or substrate, is referred to as being "on" or "under" another element, the element may be directly "on" or "under" another element, or there may be an intermediate element.

In the description of the above embodiments, the specific features, structures, materials or features may be combined in any suitable manner in any one or more embodiments or examples.

The above descriptions are optional embodiments of the present disclosure. It should be noted that one skilled in the art would make several improvements and substitutions without departing from the principles of the present disclosure. These improvements and modifications should also be regarded as the protection scope of the present disclosure.

The invention claimed is:

1. A display substrate, comprising: a display region and a peripheral region surrounding the display region;
   the display region comprises: a plurality of gate lines, a plurality of data lines, and a plurality of pixel units, and each of the plurality of pixel units comprises a driving transistor and a pixel electrode that are connected to each other; and
   the peripheral region comprises: signal lines and at least one electrostatic discharge structure for performing electrostatic discharge on the signal lines,
   wherein the electrostatic discharge structure comprises:
      a first electrostatic discharge pattern connected to the signal lines; and
      a second electrostatic discharge pattern arranged in a different layer from the first electrostatic discharge pattern, wherein a first insulating layer is arranged between the second electrostatic discharge pattern and the first electrostatic discharge pattern, so as to insulate the first electrostatic discharge pattern from the second electrostatic discharge pattern,
   an orthogonal projection of the second electrostatic discharge pattern on a base substrate of the display substrate at least partially overlaps an orthogonal projection of the first electrostatic discharge pattern on the base substrate; and
   wherein an orthogonal projection of the first electrostatic discharge pattern on the base substrate is in a shape of a continuous line with gaps between linear portions, and the first electrostatic discharge pattern is arranged in parallel to at least a part of the signal lines;
   an orthogonal projection of the second electrostatic discharge pattern on the base substrate is in a shape of a continuous line with gaps between linear portions, and the second electrostatic discharge pattern is closed end to end.

2. The display substrate of claim 1, wherein the electrostatic discharge structure further comprises:
   a first electrode connected to the signal lines; and
   a second electrode connected to the second electrostatic discharge pattern, wherein an orthogonal projection of the second electrode on the base substrate at least partially overlaps an orthogonal projection of the first electrode on the base substrate.

3. The display substrate of claim 1, wherein one of the signal lines corresponds to a plurality of the electrostatic discharge structures, in at least two of the plurality of the electrostatic discharge structures:
   a line width of the first electrostatic discharge pattern in one electrostatic discharge structure along a direction perpendicular to its own extension direction is the same as a line width of the second electrostatic discharge pattern in the same electrostatic discharge structure along a direction perpendicular to its own extension direction; the first electrostatic discharge patterns in different electrostatic discharge structures along a direction perpendicular to their own extension directions have different line widths from each other, and/or the second electrostatic discharge patterns in different electrostatic discharge structures along a direction perpendicular to their own extension directions have different line widths from each other.

4. The display substrate of claim 1, wherein the second electrostatic discharge pattern is connected to a common electrode or a common electrode line of the display substrate.

5. The display substrate of claim 1, wherein the electrostatic discharge structure comprises:
   a third electrostatic discharge pattern arranged in a different layer from the signal lines, wherein a second insulation layer is arranged between the third electrostatic discharge pattern and the signal lines; and
   a plurality of conductive patterns connected to the third electrostatic discharge pattern, wherein end portions of a part or all of the conductive patterns away from the third electrostatic discharge pattern are configured as tip portions.

6. The display substrate of claim 5, wherein the third electrostatic discharge pattern comprises a first end portion and a second end portion, wherein an orthogonal projection of the first end portion on the base substrate of the display substrate and an orthogonal projection of the second end portion on the base substrate at least partially overlap an orthogonal projection of the signal lines on the base substrate.

7. The display substrate of claim 6, wherein the first end portion and/or the second end portion is configured as a tip portion.

8. The display substrate of claim 5, wherein the electrostatic discharge structure further comprises: a fourth electrostatic discharge pattern arranged in parallel or not parallel to the signal lines; and a fifth electrostatic discharge pattern arranged in parallel or not parallel to the signal lines,
   an orthogonal projection of the fourth electrostatic discharge pattern on the base substrate and an orthogonal projection of the fifth electrostatic discharge pattern on the base substrate are both located inside an orthogonal projection of the plurality of signal lines on the base substrate;
   a first end portion of the third electrostatic discharge pattern is located between the signal lines and the fourth electrostatic discharge pattern, and an orthogonal projection of the first end portion of the third electrostatic discharge pattern on the base substrate at least partially overlaps an orthogonal projection of the fourth electrostatic discharge pattern on the base substrate; and a second end portion of the third electrostatic discharge pattern is located between the signal lines and the fifth electrostatic discharge pattern, and an orthogonal projection of the second end portion of the third electrostatic discharge pattern on the base substrate at least partially overlaps an orthogonal projection of the fifth electrostatic discharge pattern on the base substrate.

9. The display substrate of claim 8, wherein the fourth electrostatic discharge pattern and/or the fifth electrostatic discharge pattern are arranged in a same layer and made of a same material as the active layer in the display substrate.

10. The display substrate of claim 8, wherein the at least partially overlapping orthogonal projection portion of the fourth electrostatic discharge pattern is formed of an intrinsic semiconductor material; and/or the at least partially overlapping orthogonal projection portion of the fifth electrostatic discharge pattern is formed of an intrinsic semiconductor material.

11. A display device, comprising the display substrate according to claim 1.

12. The display device of claim 11, wherein the electrostatic discharge structure further comprises:
    a first electrode connected to the signal lines; and
    a second electrode connected to the second electrostatic discharge pattern, wherein an orthogonal projection of the second electrode on the base substrate at least partially overlaps an orthogonal projection of the first electrode on the base substrate.

13. The display device of claim 11, wherein one of the signal lines corresponds to a plurality of the electrostatic discharge structures, in at least two of the plurality of the electrostatic discharge structures:
    a line width of the first electrostatic discharge pattern in one electrostatic discharge structure along a direction perpendicular to its own extension direction is the same as a line width of the second electrostatic discharge pattern in the same electrostatic discharge structure along a direction perpendicular to its own extension direction; the first electrostatic discharge patterns in different electrostatic discharge structures along a direction perpendicular to their own extension directions have different line widths from each other, and/or the second electrostatic discharge patterns in different electrostatic discharge structures along a direction perpendicular to their own extension directions have different line widths from each other.

14. The display device of claim 11, wherein the second electrostatic discharge pattern is connected to a common electrode or a common electrode line of the display substrate.

15. The display device of claim 11, wherein the electrostatic discharge structure comprises:
    a third electrostatic discharge pattern arranged in a different layer from the signal lines, wherein a second insulation layer is arranged between the third electrostatic discharge pattern and the signal lines; and
    a plurality of conductive patterns connected to the third electrostatic discharge pattern, wherein end portions of a part or all of the conductive patterns away from the third electrostatic discharge pattern are configured as tip portions.

16. The display device of claim 15, wherein the third electrostatic discharge pattern comprises a first end portion and a second end portion, wherein an orthogonal projection of the first end portion on the base substrate of the display substrate and an orthogonal projection of the second end portion on the base substrate at least partially overlap an orthogonal projection of the signal lines on the base substrate.

17. The display device of claim 16, wherein the first end portion and/or the second end portion is configured as a tip portion.

18. The display device of claim 15, wherein the electrostatic discharge structure further comprises: a fourth electrostatic discharge pattern arranged in parallel or not parallel to the signal lines; and a fifth electrostatic discharge pattern arranged in parallel or not parallel to the signal lines,
    an orthogonal projection of the fourth electrostatic discharge pattern on the base substrate and an orthogonal projection of the fifth electrostatic discharge pattern on the base substrate are both located inside an orthogonal projection of the plurality of signal lines on the base substrate;
    a first end portion of the third electrostatic discharge pattern is located between the signal lines and the fourth electrostatic discharge pattern, and an orthogonal projection of the first end portion of the third electrostatic discharge pattern on the base substrate at least partially overlaps an orthogonal projection of the fourth electrostatic discharge pattern on the base substrate; and
    a second end portion of the third electrostatic discharge pattern is located between the signal lines and the fifth electrostatic discharge pattern, and an orthogonal projection of the second end portion of the third electrostatic discharge pattern on the base substrate at least partially overlaps an orthogonal projection of the fifth electrostatic discharge pattern on the base substrate.

19. The display device of claim 18, wherein the fourth electrostatic discharge pattern and/or the fifth electrostatic discharge pattern are arranged in a same layer and made of a same material as the active layer in the display substrate.

20. The display device of claim 18, wherein the at least partially overlapping orthogonal projection portion of the fourth electrostatic discharge pattern is formed of an intrinsic semiconductor material; and/or the at least partially overlapping orthogonal projection portion of the fifth electrostatic discharge pattern is formed of an intrinsic semiconductor material.

* * * * *